(12) United States Patent
Shirai

(10) Patent No.: US 11,244,796 B2
(45) Date of Patent: Feb. 8, 2022

(54) SWITCH DEVICE AND ASSEMBLY METHOD OF SWITCH DEVICE

(71) Applicant: Valeo Japan Co., Ltd., Saitama (JP)

(72) Inventor: Takehito Shirai, Tokyo (JP)

(73) Assignee: Valeo Japan Co., Ltd.

( * ) Notice: Subject to any disclaimer, the term of this patent is extended or adjusted under 35 U.S.C. 154(b) by 244 days.

(21) Appl. No.: 16/696,666

(22) Filed: Nov. 26, 2019

(65) Prior Publication Data

US 2020/0168416 A1 May 28, 2020

(30) Foreign Application Priority Data

Nov. 27, 2018 (JP) .............................. JP2018-220894

(51) Int. Cl.
*H01H 36/00* (2006.01)
*B62D 1/04* (2006.01)
*H01H 19/60* (2006.01)

(52) U.S. Cl.
CPC ............. *H01H 36/00* (2013.01); *B62D 1/046* (2013.01); *H01H 19/60* (2013.01)

(58) Field of Classification Search
CPC ........ H01H 19/60; H01H 25/04; H01H 36/00; B62D 1/046; H03K 2217/94068
See application file for complete search history.

(56) References Cited

U.S. PATENT DOCUMENTS

2016/0057321 A1    2/2016   Yamaura et al.

FOREIGN PATENT DOCUMENTS

| EP | 1598725 A2 | 11/2005 |
| EP | 2246770 A2 | 11/2010 |
| JP | 2010-073568 A | 4/2010 |

OTHER PUBLICATIONS

English abstract for JP-2010-073568.
Extended European Search Report dated Apr. 9, 2020 for copending European Patent Appl. No. EP19199268.4.

*Primary Examiner* — Ramon M Barrera
(74) *Attorney, Agent, or Firm* — Fishman Stewart PLLC

(57) ABSTRACT

A switch device may include a rotatable knob provided to be rotatable around a first axis and capable of swinging around a second axis in parallel with the first axis. The switch device may also include a magnet disposed coaxially with the second axis and configured to rotate in conjunction with rotation of the rotatable knob. The switch device may also have a magnetic sensor provided on a fixed-side member and disposed to face an outer periphery of the magnet. The switch device may further include a gear train configured to transmit the rotation of the rotatable knob to the magnet.

9 Claims, 11 Drawing Sheets

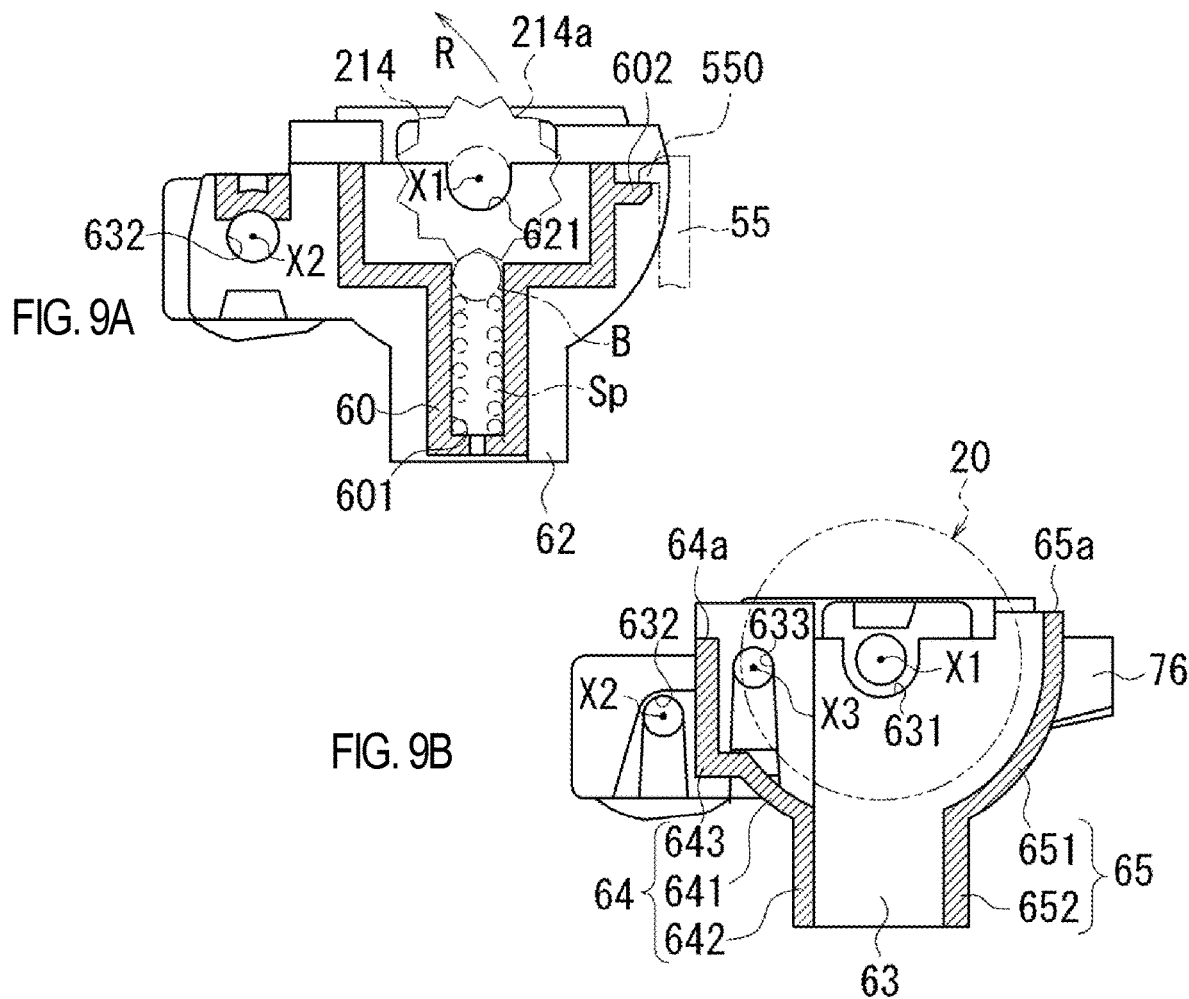
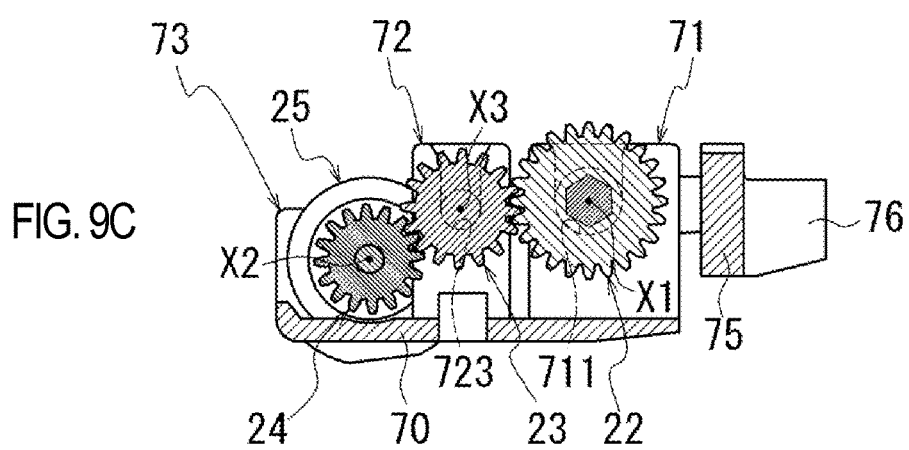

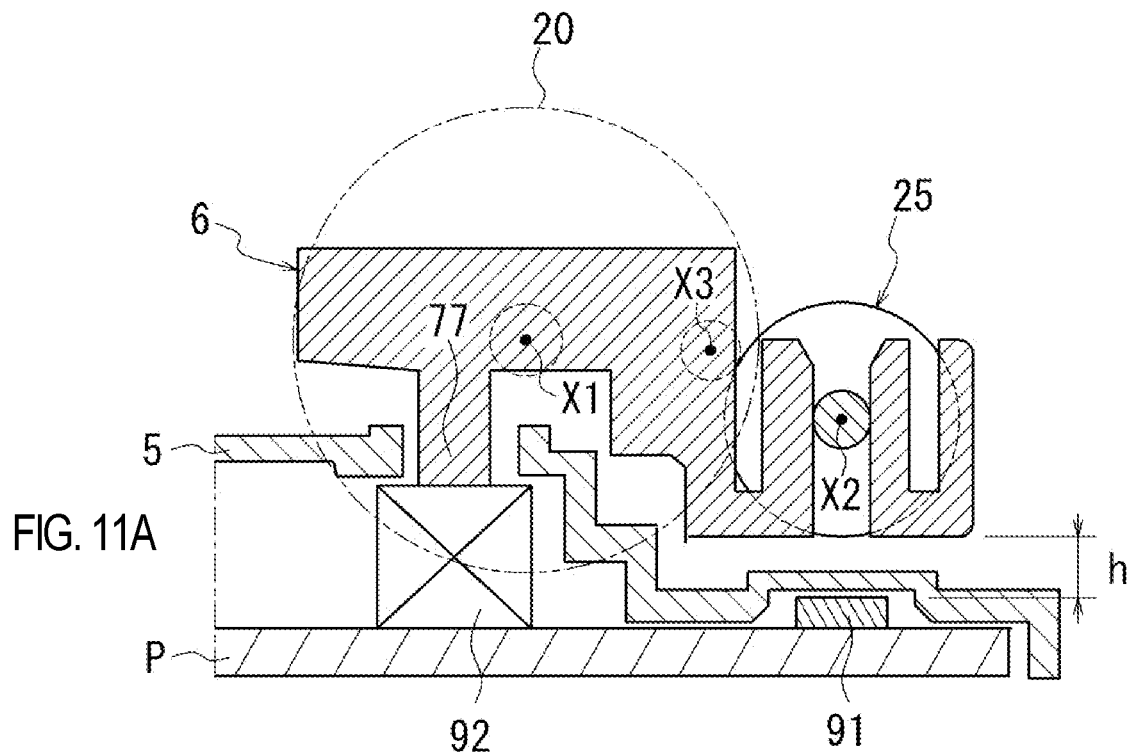
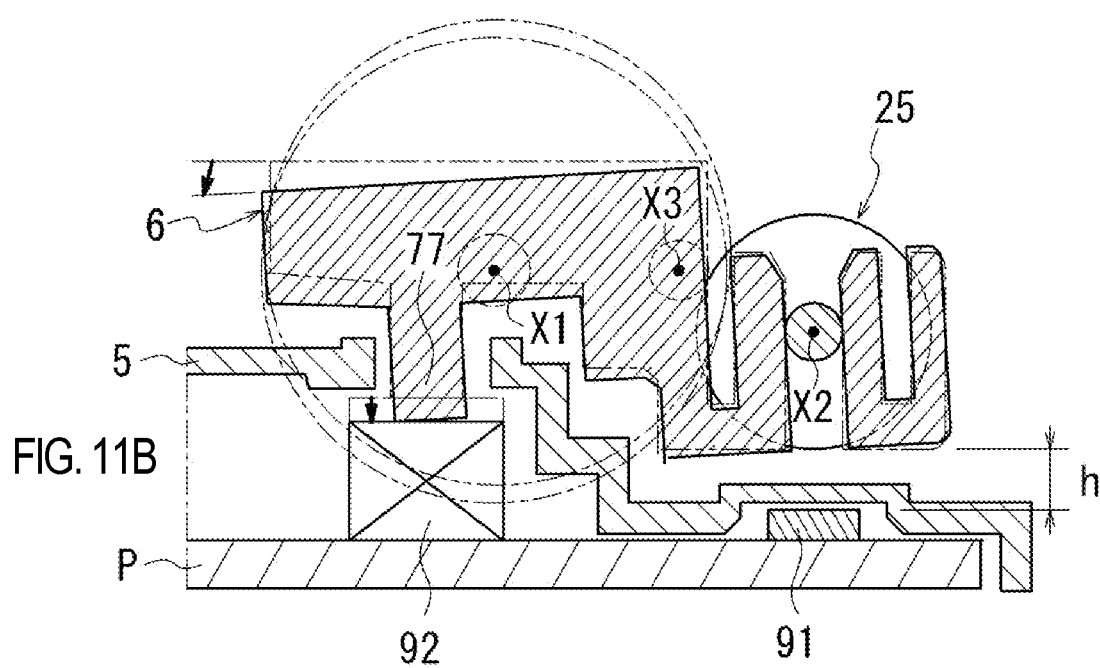

SWITCH DEVICE AND ASSEMBLY METHOD OF SWITCH DEVICE

CROSS-REFERENCE TO RELATED APPLICATION

This application claims priority under 35 USC 119 from Japanese Patent Application No. 220894/2018 filed on Nov. 27, 2018, the disclosure of which is incorporated by reference herein.

TECHNICAL FIELD

The present invention relates to a switch device and an assembly method of the switch device.

BACKGROUND

Japanese Patent Laid-Open Publication No. 2010-073568 discloses a switch device that has a rotatable knob, in which different functions are assigned to a rotation operation of the rotatable knob, and a swing operation of the rotatable knob.

In the switch device according to Japanese Patent Laid-Open Publication No. 2010-073568, a different function is assigned to each angular position around an axis of rotation of the rotatable knob. In the switch device according to Japanese Patent Laid-Open Publication No. 2010-073568, the angular position around the axis of rotation of the rotatable knob is detected by a magnetic sensor provided on a board, and a magnet provided at the rotatable knob.

Further, in the switch device according to Japanese Patent Laid-Open Publication No. 2010-073568, a push switch provided on the board is turned on/off in response to the swing operation of the rotatable knob, and thereby the swing operation of the rotatable knob is detected.

Here, when the rotatable knob swings, a positional relationship between the magnetic sensor and the magnet provided at the rotatable knob changes. Therefore, in order to detect the angular position of the rotatable knob in the state where the rotatable knob is swung, it is necessary to adopt a magnetic sensor with high sensitivity.

As the magnetic sensor is the higher in sensitivity, the unit price is the higher. Consequently, as the more functions are assigned to the rotatable knob, the higher detection accuracy is required. As a result, the magnetic sensor in use is higher in sensitivity, and production costs of the switch device increase.

SUMMARY

Consequently, there is a need to be able to inexpensively provide a switch device in which different functions are assigned to a rotation operation of a rotatable knob and a swing operation of the rotatable knob.

According to an aspect of the present invention, a switch device includes a rotatable knob that is provided to be rotatable around a first axis and to be swingable around a second axis in parallel with the first axis, a magnet that is disposed coaxially with the second axis and configured to rotate in conjunction with rotation of the rotatable knob, a magnetic sensor that is provided on a fixed-side member and disposed to face an outer periphery of the magnet, and a gear train configured to transmit rotation of the rotatable knob to the magnet.

According to the aspect of the present invention, the switch device can be provided at a lower price, in which the different functions are assigned to the rotation operation of the rotatable knob and the swing operation of the rotatable knob.

BRIEF DESCRIPTION OF THE DRAWINGS

Other objects, features, and advantages of the present invention will become more apparent from the following detailed description made with reference to the accompanying drawings, in which like parts are designated by like reference numbers and in which:

FIGS. 9A to 9C are drawings explaining the moving block of the switch device;

FIGS. 11A and 11B are drawings explaining a displacement of the moving block at the time of an operation of the rotary switch.

DETAILED DESCRIPTION

Hereinafter, an embodiment of the present invention will be described.

Figure 1:
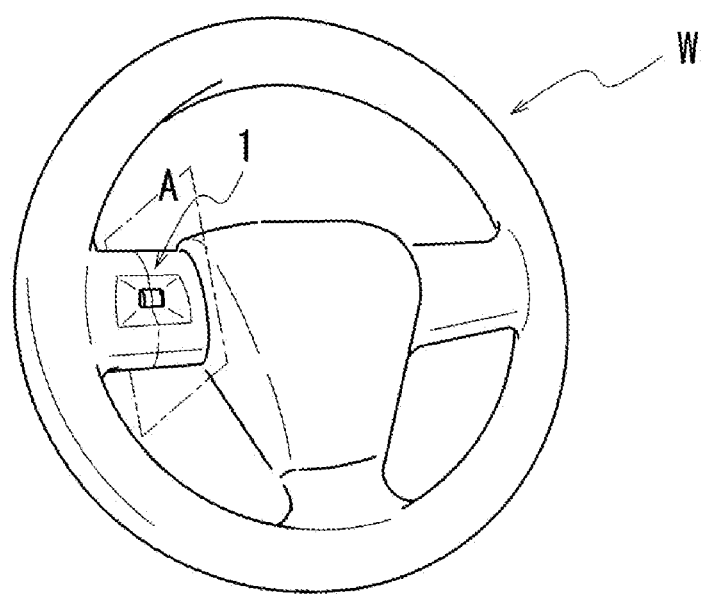
FIG. 1 is a diagram explaining a switch device according to an embodiment of the present invention.

FIG. 1 is a diagram explaining disposition of a switch device 1 in a steering wheel W.

Figure 2:
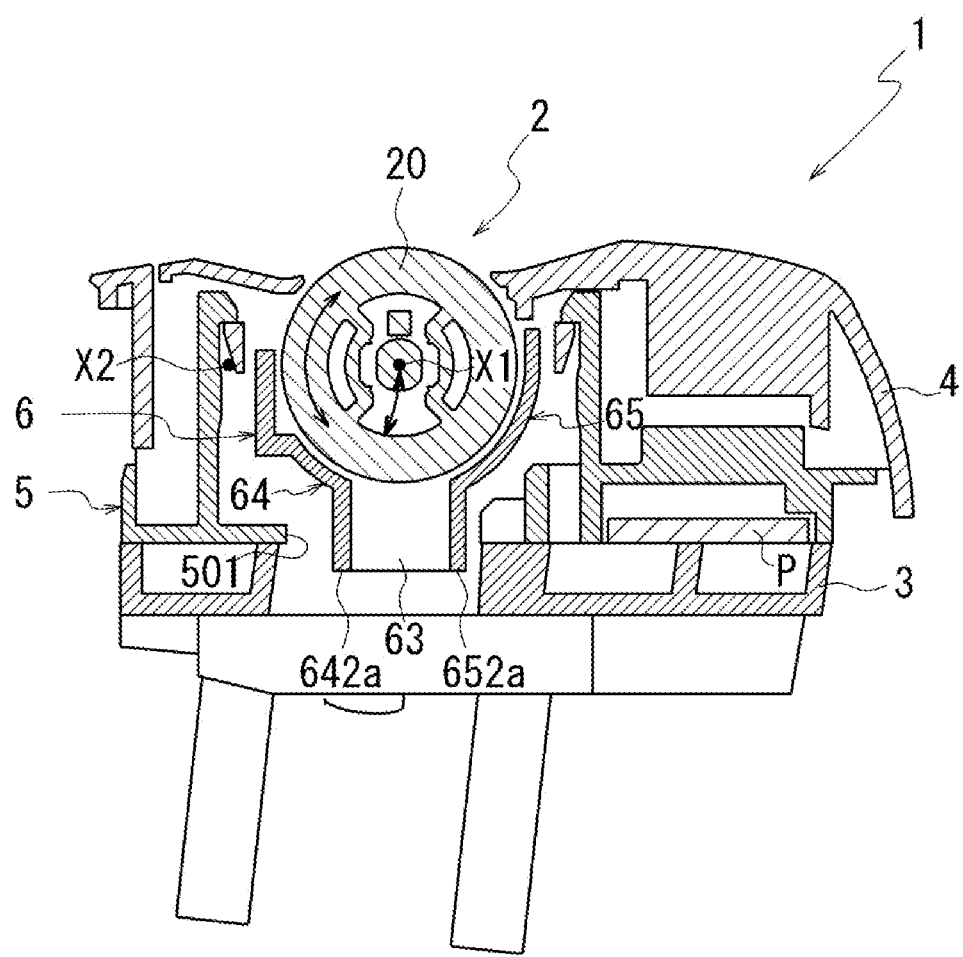
FIG. 2 is a sectional view of the switch device.

FIG. 2 is a sectional view of the switch device 1 cut along a plane A in FIG. 1.

Figure 3:
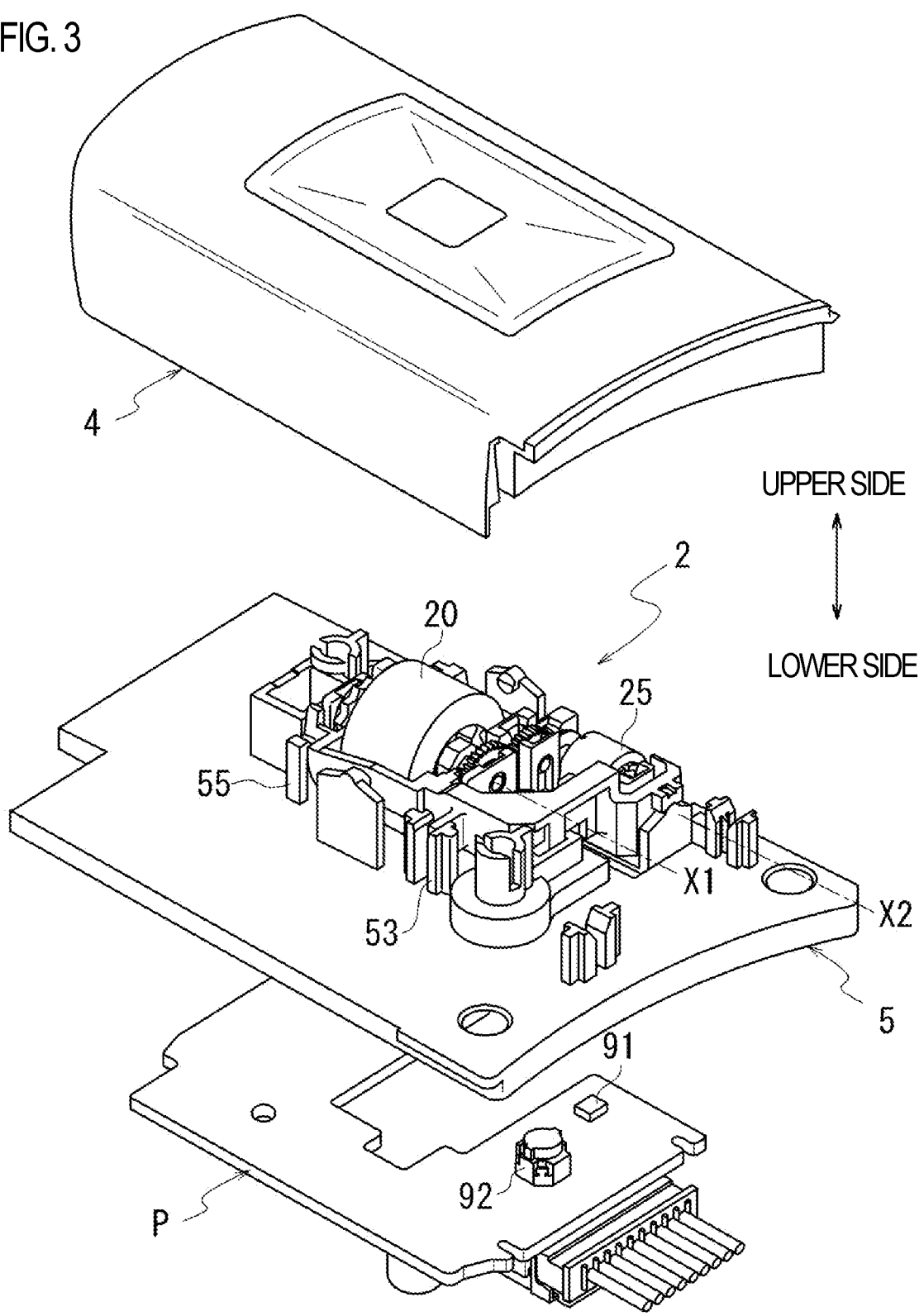
FIG. 3 is an exploded perspective view of the switch device.

FIG. 3 is an exploded perspective view showing a main part of the switch device by disassembling the main part.

Figure 4:
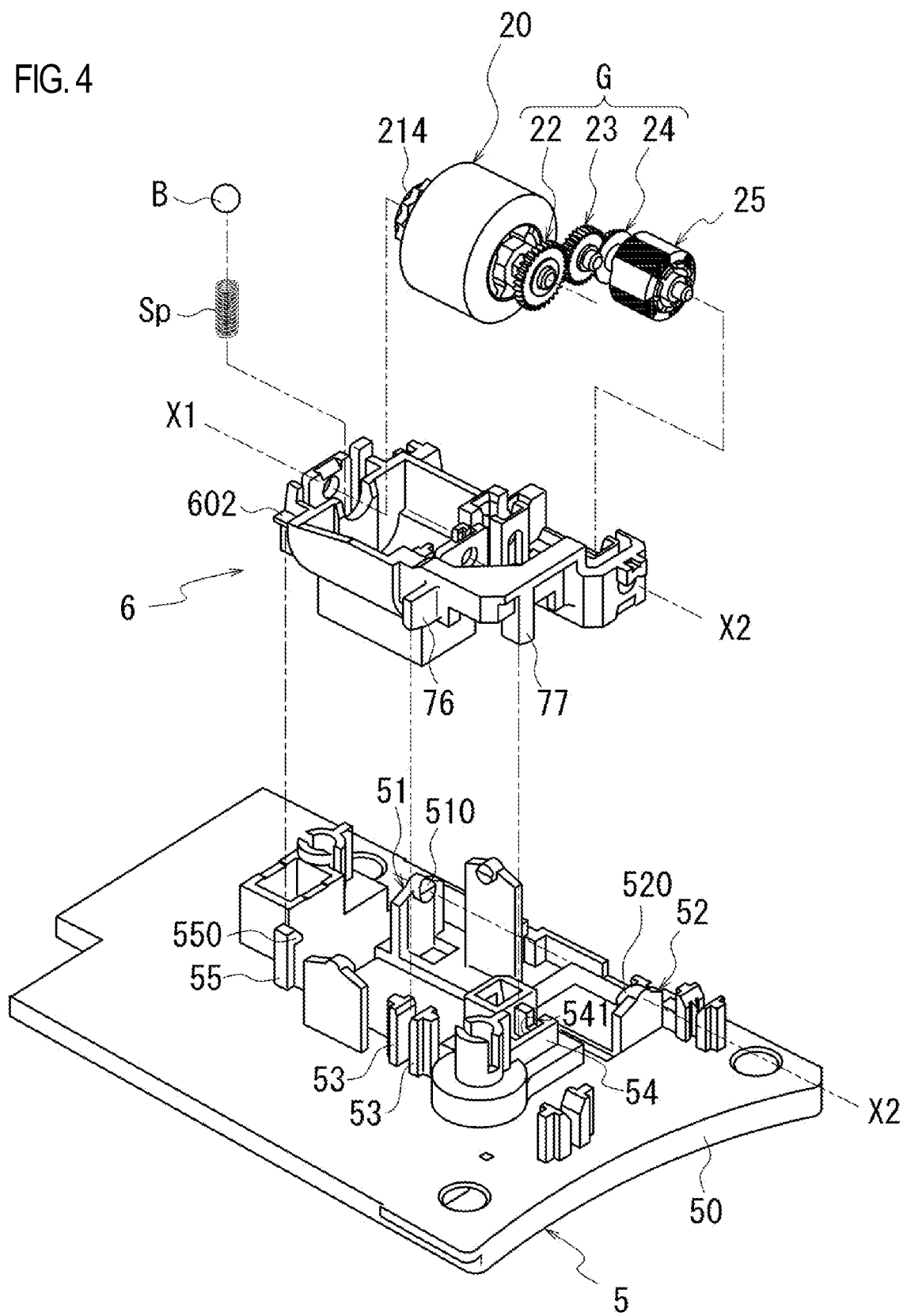
FIG. 4 is an exploded perspective view of the switch device.

FIG. 4 is an exploded perspective view showing constituent elements of an intermediate member 5 and a moving block 6 of the switch device 1 by disassembling the constituent elements.

Figure 5A:
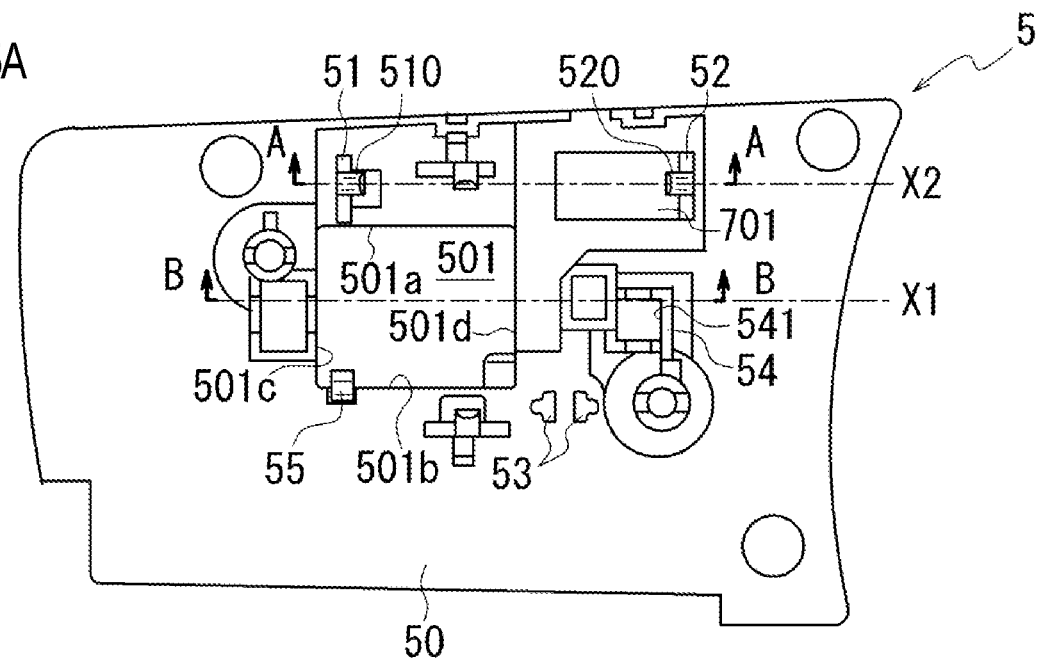
FIGS. 5A to 5C are drawings explaining an intermediate member of the switch device.
Figure 5B:
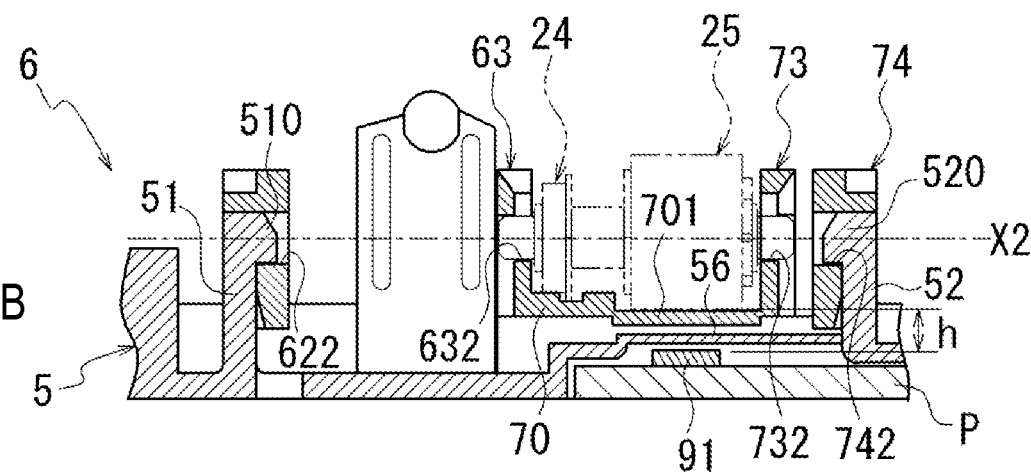
Figure 5C:
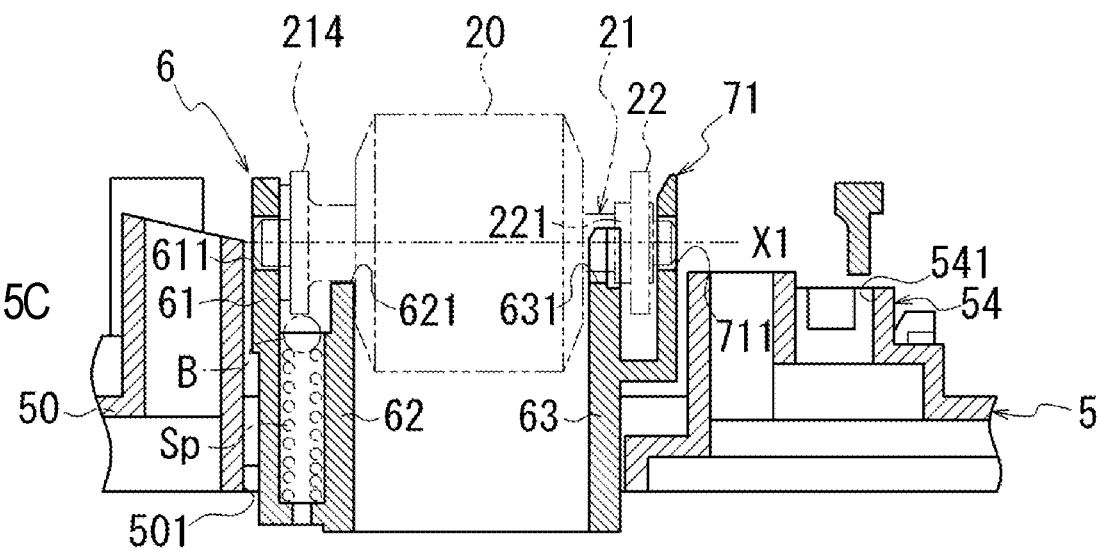

FIGS. 5A to 5C are drawings explaining the intermediate member 5. FIG. 5A is a planar view of the intermediate member 5 as seen from above a cover side. FIG. 5B is a view showing a section taken along line A-A in FIG. 5A with the moving block 6 which is assembled to the intermediate member 5. FIG. 5C is a drawing showing a section taken along line B-B in FIG. 5A with the moving block 6 which is assembled to the intermediate member 5.

Note that FIG. 5A shows only a region where the moving block 6 is assembled, for descriptive purposes. FIG. 5B shows a magnet 25 and the surroundings of the magnet 25 by a virtual line, and FIG. 5C shows a rotatable knob 20 and the surroundings of the rotatable knob 20 by a virtual line.

In the following explanation, for descriptive purposes, a positional relationship of respective constituent elements of the switch device 1 is described with a vertical direction in FIG. 3 as a reference.

As shown in FIG. 1, the switch device 1 is provided at a spoke section of the steering wheel W, and has the rotatable knob 20 which is operated by a user.

As shown in FIG. 2, in the switch device 1, the rotatable knob 20 is provided to be rotatable around a rotational axis X1 (a first axis).

In the switch device 1, the moving block 6 that rotatably supports the rotatable knob 20 is provided to be capable of swinging in a circumferential direction around a rotational axis X2 (a second axis) that is in parallel with the rotational axis X1.

In the switch device 1, different functions are assigned to a rotation operation of the rotatable knob 20, and a swing operation (a pressing operation) of the rotatable knob 20.

As shown in FIG. 2, in the switch device 1, an intermediate member 5 that supports the moving block 6 is housed between a pole board 3 that supports a printed board P, and a cover 4 that is assembled by being fitted over the pole board 3.

The intermediate member 5 also has a function of preventing water, dust and the like from reaching the printed board P by covering a top surface (a top surface on a cover 4-side) of the printed board P on which a magnetic sensor is provided, that is, a function as a protection member that protects the printed board P.

As shown in FIG. 4 and FIGS. 5A to 5C, the intermediate member 5 has a pair of support walls 51 and 52 for supporting the moving block 6. The support walls 51 and 52 are plate-shaped members that extend upward to the cover 4-side from a plate-shaped base section 50 of the intermediate member 5. The support walls 51 and 52 are respectively provided in orientations orthogonal to the rotational axis X2 in positions intersecting with the rotational axis X2 which is in parallel with the rotational axis X1 of the rotatable knob 20.

In the support walls 51 and 52, columnar support shafts 510 and 520 protrude in directions to approach each other along the rotational axis X2.

The support shafts 510 and 520 are provided to face each other on the common rotational axis X2, and the moving block 6 which rotatably supports the rotatable knob 20 is supported to be capable of swinging by the pair of support shafts 510 and 520.

As shown in FIG. 5A, an opening 501 that penetrates through the base section 50 in a thickness direction is provided in a position adjacent to the support wall 51. In the planar view, the opening 501 is formed in a substantially rectangular shape by a pair of long side portions 501a and 501b that are in parallel with each other, and short side portions 501c and 501d that connect end portions of the long side portions 501a and 501b.

In the pair of long side portions 501a and 501b which are in parallel with the rotational axis X1, the support wall 51 is provided at a position which is in the vicinity of the one long side portion 501a and close to the one short side portion 501c.

As seen from the opening 501, a stopper rod 55 is provided at the opposite side to the support wall 51.

As shown in FIG. 4, the stopper rod 55 extends upward to the cover 4-side from the base section 50, and a locking claw 550 that protrudes to an opening 501-side is provided at an upper end of the stopper rod 55.

The locking claw 550 is configured to be locked to a locking section 602 at a moving block 6-side when the moving block 6 is assembled to the intermediate member 5.

As shown in FIG. 5A, a pair of guide pillars 53 and 53 are provided in a position which is more separated from the rotational axis X1 than the long side portion 501b, at a support wall 52-side (the right side in the drawing) from the short side portion 501d of the opening 501.

The guide pillars 53 and 53 extend upward to the cover 4-side from the base section 5, and are provided with a space in a direction of the rotational axis X1.

Between the guide pillars 53 and 53, a guide plate 76 (see FIG. 4) at the moving block 6-side is inserted when the moving block 6 is attached to the intermediate member 5. The guide plate 76 moves in conjunction with the swinging of the moving block 6, and displaces in a vertical direction between the guide pillars 53 and 53.

In the present embodiment, the moving block 6 is supported in a cantilever manner with the pair of support walls 51 and 52. Therefore, the moving block 6 is likely to deviate positionally in the direction of the rotational axis X1 by an urging force that is generated at the time when the rotational axis X1-side where the guide plate 76 is provided presses the rotatable knob 20. The guide pillars 53 and 53 are provided to restrict the positional deviation in the direction of the rotational axis X1 of the moving block 6.

Closer to a support wall 52-side (the right side in the drawing) than the pair of guide pillars 53 and 53, a through hole 541 that penetrates through the base section 50 of the intermediate member 5 in a thickness direction, and a cylindrical section 54 that surrounds the through hole 541 are provided.

A pressing rod 77 (refer to FIG. 4) on the moving block 6-side is inserted into the through hole 541 when the moving block 6 is attached to the intermediate member 5.

Figure 6A:
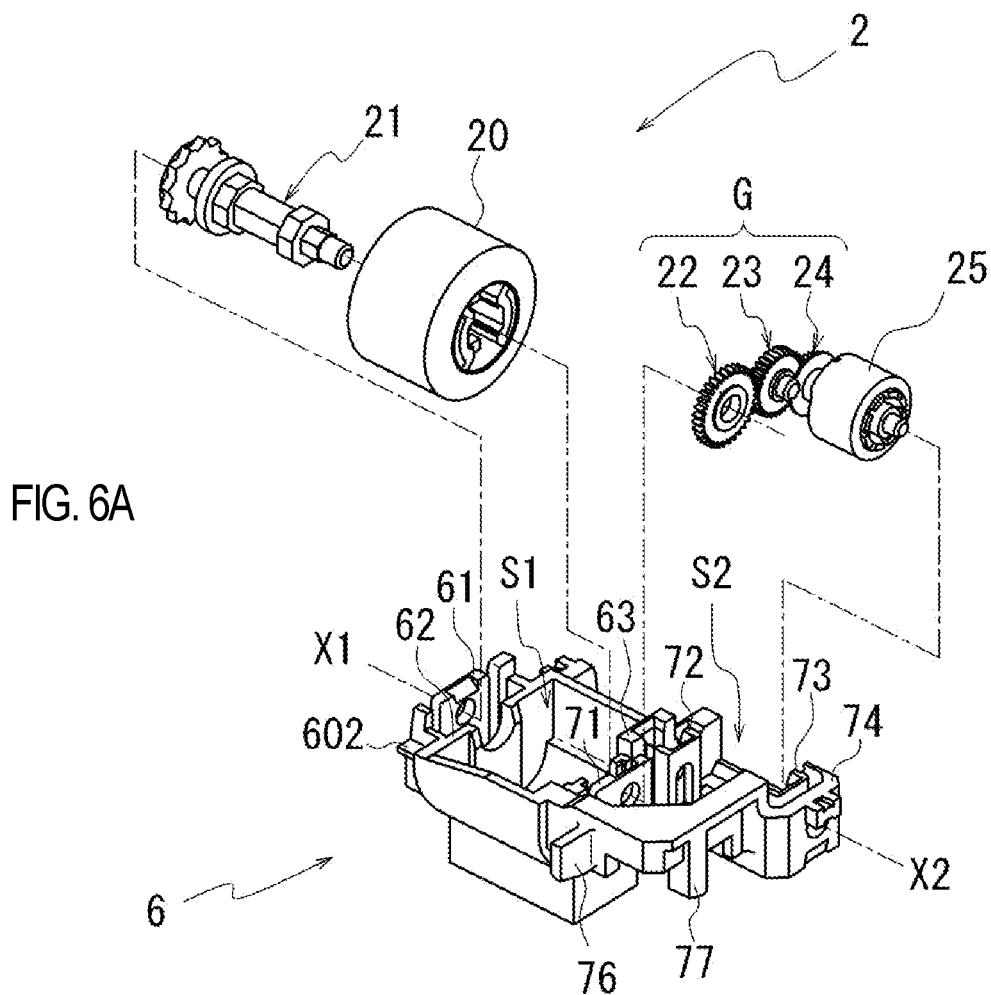
FIGS. 6A and 6B are exploded perspective views explaining the surroundings of a rotary switch of the switch device.
Figure 6B:
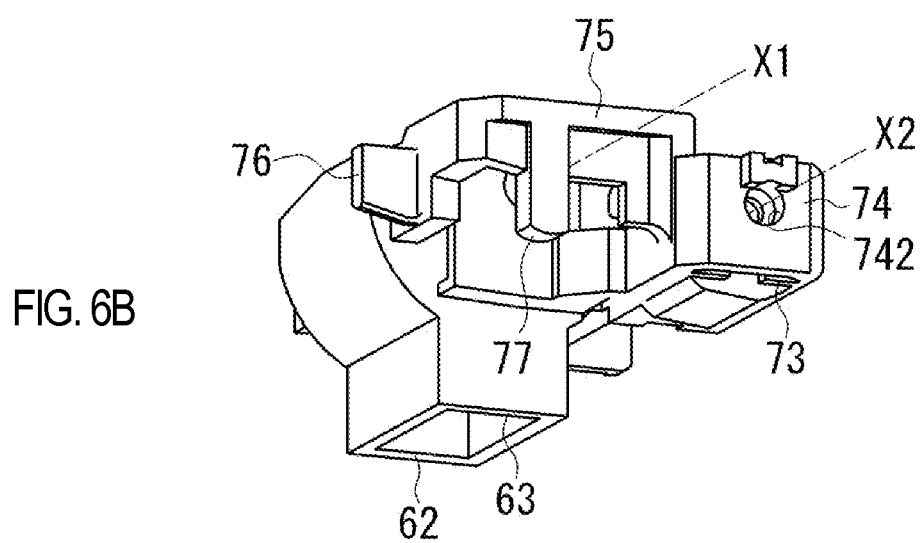

FIGS. 6A and 6B are exploded perspective views explaining components relating to the rotary switch 2. FIG. 6A is a perspective view showing the rotatable knob 20, a reduction gear train G, and the magnet 25 which are separated from the moving block 6. FIG. 6B is a perspective view of the moving block 6 as seen from diagonally below.

As shown in FIG. 6A, the moving block 6 is a box-shaped member (a holder) for supporting constituent elements (the rotatable knob 20, the magnet 25, the reduction gear train G) of the rotary switch 2, and has a housing section S1 for the rotatable knob 20, and a housing section S2 for the magnet 25.

The rotary switch 2 has the ring-shaped rotatable knob 20, a shaft section 21 that rotates around the rotational axis X1 integrally with the rotatable knob 20, and the reduction gear train G that reduces rotation of the rotatable knob 20 to transmit the reduced rotation to the magnet 25.

The reduction gear train G has a first gear 22 that rotates integrally with the shaft section 21, a second gear 24 that rotates integrally with the magnet 25, and a transmission gear 23 that is meshed with the first gear 22 and the second gear 24.

As shown in FIG. 9C, the rotational axis X1 of the first gear 22, a rotational axis X3 of the transmission gear 23, and the rotational axis X2 of the second gear 24 are in parallel with one another.

When the rotatable knob 20 rotates around the rotational axis X1 by an operation of the user, the magnet 25 rotates around the rotational axis X2 with the rotation that is transmitted via the reduction gear train G (the first gear 22, the transmission gear 23 and the second gear 24), in the rotary switch 2.

Figure 7A:
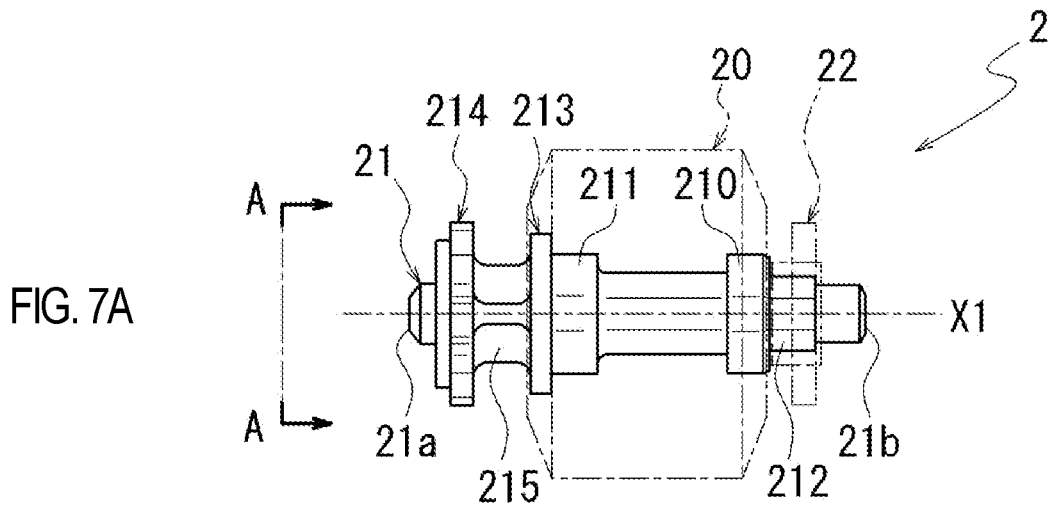
FIGS. 7A to 7C are drawings explaining the rotary switch of the switch device.
Figure 7B:
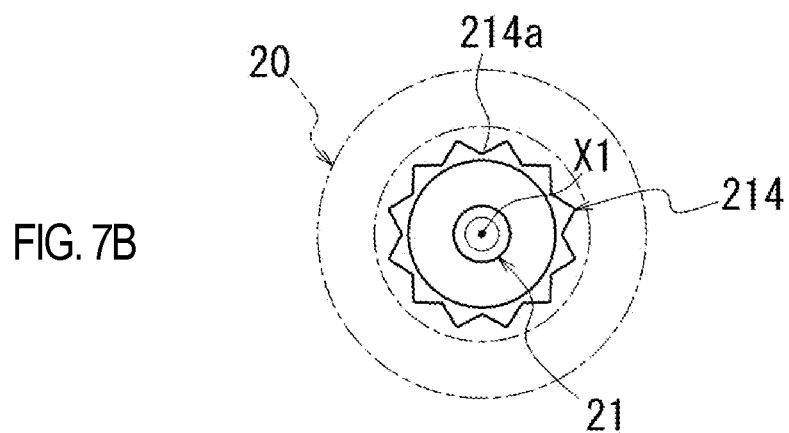
Figure 7C:
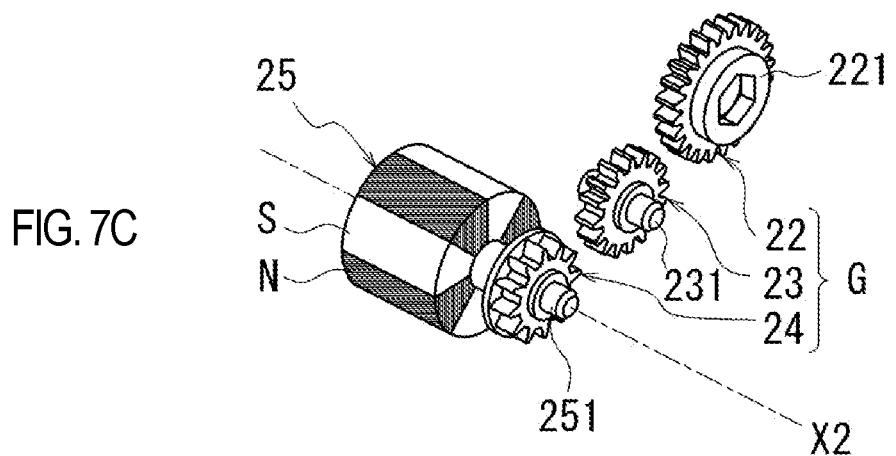

FIGS. 7A to 7C are drawings explaining the rotary switch 2. FIG. 7A is a plan view of the shaft section 21 that has the rotatable knob 20 assembled to an outer periphery, as seen from a radial direction. FIG. 7B is a drawing of the shaft section 21 as seen from a direction of arrows A-A in FIG. 7A.

FIG. 7C is a drawing explaining disposition of the reduction gear train G (the first gear 22, the transmission gear 23 and the second gear 24) and the magnet 25.

Note that in FIGS. 7A and 7B, the rotatable knob 20 is shown by a virtual line for descriptive purposes. In FIG. 7C, the first gear 22, the transmission gear 23 and the second gear 24 are shown by being separated from one another. As shown in FIG. 7C, the present embodiment adopts the magnet 25 in which N and S poles are alternately magnetized in a circumferential direction around the rotational axis X2 on a cylindrical outer peripheral part.

Note that in FIG. 7C, for descriptive purposes, the magnet 25 is described simply, and regions where N pole is magnetized are shown by applying hatching to the regions so that the regions where the N pole is magnetized, and regions where the S pole is magnetized can be visually distinguished. The same is true for FIG. 4.

As shown in FIG. 7A, the shaft section 21 penetrates through the rotatable knob 20 in the direction of the rotational axis X1. In the shaft section 21, a pair of connection sections 210 and 211 are provided in a region where the rotatable knob 20 is fixed to an outer periphery. The connection sections 210 and 211 are formed in a polygonal shape in sectional view, and are fixed to outer peripheries of the connection sections 210 and 211 in a state where a region at one end side in a longitudinal direction of the rotatable knob 20 and a region at the other end side are respectively prevented from rotating. The rotatable knob 20 has a circular outer shape in sectional view, and an outer circumferential surface of the rotatable knob 20 acts as an operation surface that is operated by fingers of the user.

In the shaft section 21, a flange section 213 with a larger diameter than the connection section 211 is provided adjacently to the connection section 211, at one end 21a-side as seen from the connection section 211. A moderation board 214 is provided at a position separated to the one end 21a-side from the flange section 213.

The moderation board 214 is formed with an outside diameter slightly larger than an outside diameter of the flange section 213. On an outer periphery of the moderation board 214, moderation grooves 214a are provided throughout an entire periphery in the circumferential direction around the rotational axis X1 (see FIG. 7B).

In the shaft section 21, an externally fitted section 212 with a smaller diameter than the connection section 210 is provided adjacently to the connection section 210, at the other end 21b-side as seen from the connection section 210.

The first gear 22 of the reduction gear train G is externally fitted onto an outer periphery of the externally fitted section 212, and the first gear 22 is fixed to the shaft section 21 (the externally fitted section 212) in a state where the first gear 22 is prevented from rotating.

As illustrated in FIG. 5C, a ball B that is urged by a spring Sp elastically engages with the moderation board 214 from a radial direction of the rotational axis X1 when the shaft section 21 is assembled to the moving block 6.

FIG. 8A to FIG. 10B are drawings explaining the moving block 6.

Figure 8A:
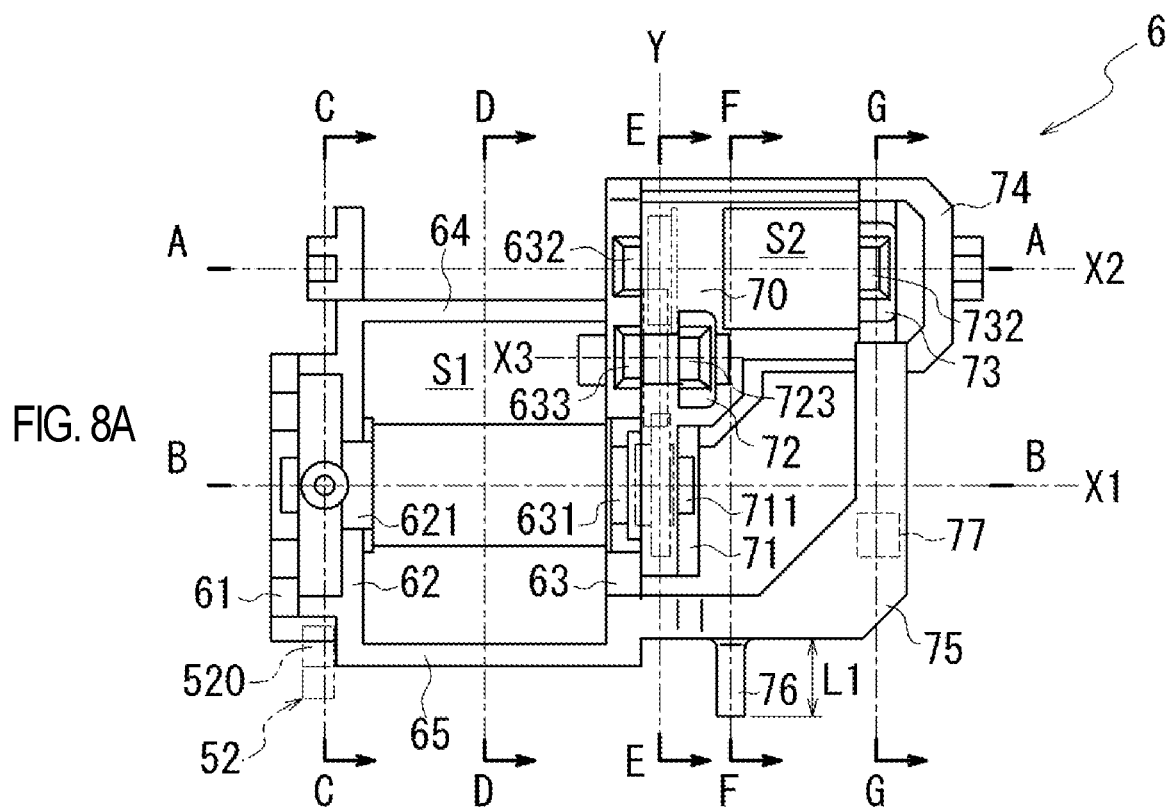
FIGS. 8A to 8C are drawings explaining a moving block of the switch device.
Figure 8B:
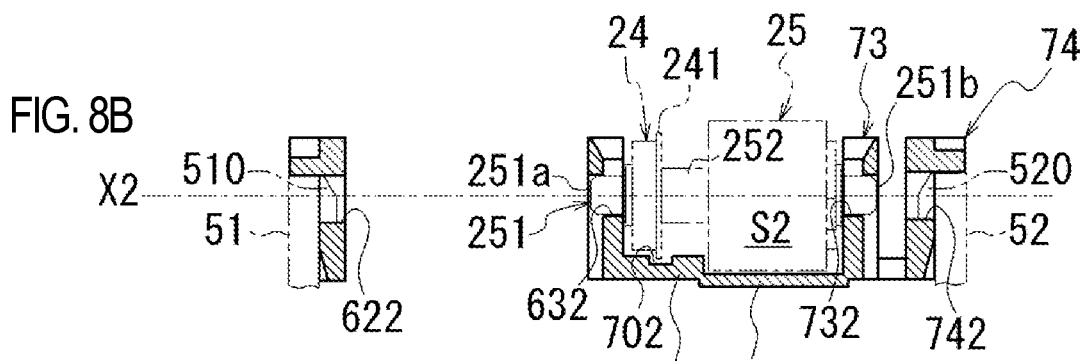
Figure 8C:
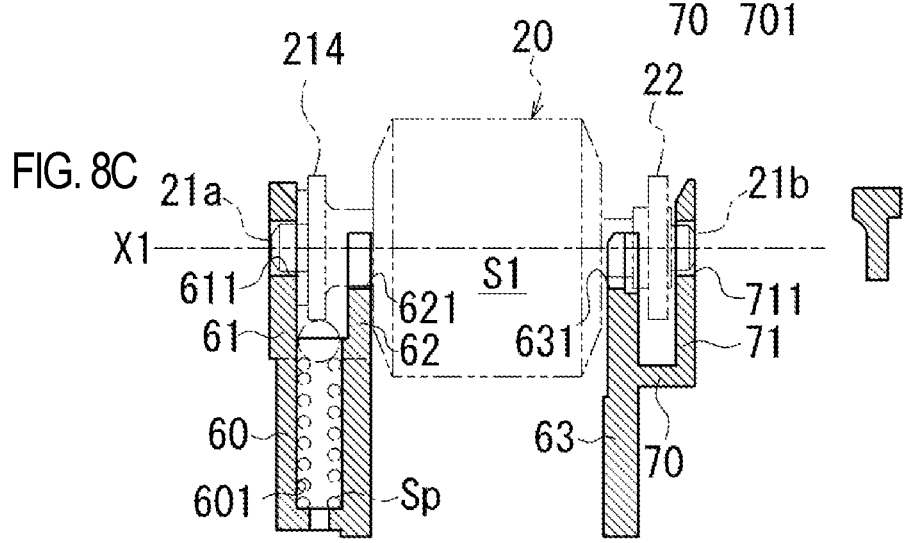

FIG. 8A is a planar view of the moving block 6 as seen from above the cover 4-side. FIG. 8B is a sectional view taken along line A-A in FIG. 8A. FIG. 8C is a sectional view taken along line B-B in FIG. 8A.

Figure 10A:
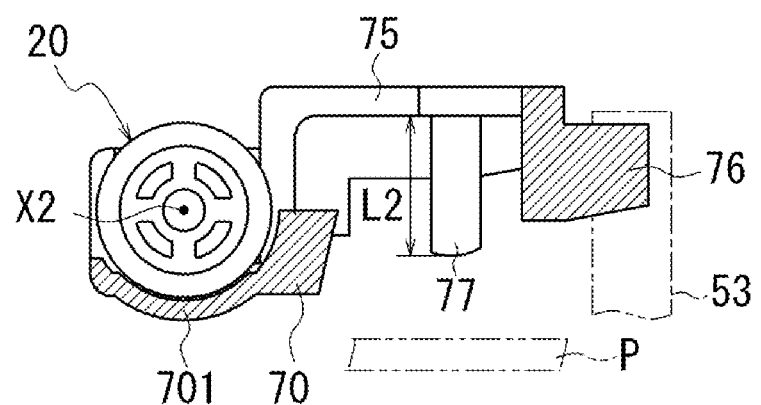
FIGS. 10A and 10B are drawings explaining the moving block of the switch device.
Figure 10B:
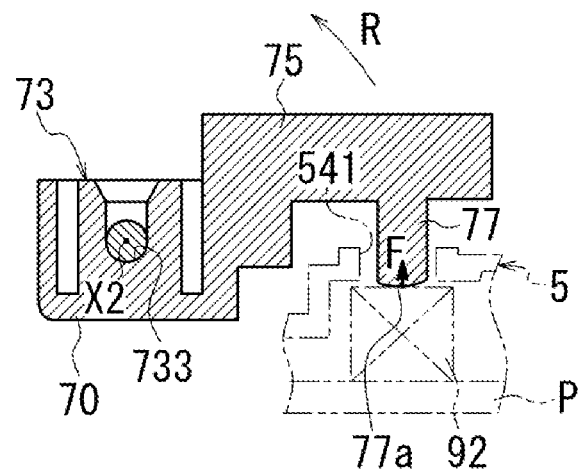

FIG. 9A is a sectional view taken along line C-C in FIG. 8A. FIG. 9B is a sectional view taken along line D-D in FIG. 8A. FIG. 9C is a sectional view taken along line E-E in FIG. 8A. FIG. 10A is a sectional view taken along line F-F in FIG. 8A. FIG. 10B is a sectional view taken along line G-G in FIG. 8A.

As shown in FIGS. 8A to 8C, the housing section S1 for the rotatable knob 20 is formed between a pair of partition walls 62 and 63 that are disposed with a space in the direction of the rotational axis X1. The housing section S2 for the magnet 25 is formed between the partition wall 63 and a support wall 73, at the opposite side (the right side in the drawing) from the partition wall 62 as seen from the partition wall 63.

In the vicinity of the partition wall 63 at the opposite side (the right side in the drawing) from the partition wall 62 as seen from the partition wall 63, a support wall 71 for supporting the first gear 22 of the reduction gear train G, and a support wall 72 for supporting the transmission gear 23 are provided side by side in a direction orthogonal to the rotational axis X1.

The partition wall 63, and the support walls 71, 72 and 73 are connected to one another at a bottom wall section 70 (see FIGS. 8B and 8C) that extends sideward from the partition wall 63, and have a positional relationship fixed by the bottom wall section 70.

The partition walls 62 and 63 that configure the housing section 51 of the rotatable knob 20 are provided in an orientation orthogonal to the rotational axis X1. At both sides (both sides in the vertical direction in FIG. 8A) with the rotational axis X1 therebetween, side walls 64 and 65 that connect the partition walls 62 and 63 to each other are provided.

As shown in FIG. 9B, in sectional view orthogonal to the rotational axis X1, the side wall 64 has an arc-shaped portion 641 that surrounds the outer periphery of the rotatable knob 20 at a predetermined space, a straight portion 642 that extends downward from a lower end of the arc-shaped portion 641, and a bent portion 643 that extends upward at a lateral side of the rotatable knob 20 from an upper end of the arc-shaped portion 641.

The side wall 65 has an arc-shaped portion 651 that surrounds the outer periphery of the rotatable knob 20 at a predetermined interval, and a straight portion 652 that extends downward from a lower end of the arc-shaped portion 651.

An upper end 65a of the side wall 65 is located at an upper side in the vertical direction over an upper end 64a of the side wall 64.

The straight portion 642 at a side wall 64-side and the straight portion 652 at the side wall 65-side are provided in parallel with each other. As shown in FIG. 2, lower ends 642a and 652a of the straight portions 642 and 652 penetrate through the opening 501 which is provided in the intermediate member 5 and is located in a lower part at a pole board 3-side.

As shown in FIG. 8A and FIGS. 9A and 9B, the partition walls 62 and 63 are provided with support holes 621 and 631 for supporting the shaft section 21 on the rotatable knob 20-side in positions intersecting with the rotational axis X1. The support holes 621 and 631 respectively open upward to the cover 4-side, so that the shaft section 21 to which the rotatable knob 20 is fixed is assembled to the support holes 621 and 631 from an upper part on the cover 4-side.

In the support hole 621 in the partition wall 62, a large-diameter section 215 (see FIG. 7A) between the flange section 213 and the moderation board 214 in the shaft section 21 is supported, and in the support hole 631 of the partition wall 63, a cylindrical shaft section 221 (see FIG. 7C) of the first gear 22 which is externally fitted to the shaft section 21 is supported.

As shown in FIG. 8C, when the shaft section 21 is supported by the support holes 621 and 631 of the pair of partition walls 62 and 63, the shaft section 21 of the rotatable knob 20 is disposed to be rotatable around the rotational axis X1 in an orientation along the rotational axis X1.

In this state, the one end 21a of the shaft section 21 is supported to be rotatable in a state of being inserted in a support hole 611 in a side wall 61, and the moderation board 214 which is attached to the one end 21a-side of the shaft section 21 is disposed between the partition wall 62 and the side wall 61.

Further, the other end 21b of the shaft section 21 is supported to be rotatable in a state of being inserted into a support hole 711 of a support wall 71, and the first gear 22 which is attached to the other end 21b-side of the shaft section 21 is disposed between the partition wall 63 and the support wall 71.

As shown in FIG. 8C and FIG. 9A, a spring housing section 60 in a bottomed cylindrical shape is provided in a lower part between the partition wall 62 and the side wall 61.

As shown in FIG. 9A, the spring Sp is housed in a housing bore 601, which opens upward, in the spring housing section 60, and the ball B which is urged by the spring Sp elastically engages with the moderation groove 214a of the moderation board 214, between the partition wall 62 and the side wall 61.

The moderation board 214 is connected to the shaft section 21 on an outer periphery of which the rotatable knob 20 is fixed, and rotates around the rotational axis X1 in conjunction with the rotation around the rotational axis X1 of the rotatable knob 20.

When the moderation board 214 rotates around the rotational axis X1, the ball B which is urged by the spring Sp elastically engages with another moderation groove 214a that is adjacent in a rotation direction of the moderation board 214.

In the present embodiment, the moderation board 214 and the ball B which is urged by the spring Sp configure a moderation mechanism, and the rotatable knob 20 has different functions to be assigned in response to angular positions around the rotational axis X1.

The moderation mechanism is provided to position the angular positions around the rotational axis X1 of the rotatable knob 20 to predetermined positions corresponding to the functions, and to give sense of moderation to the rotation operation around the rotational axis X1 of the rotatable knob 20.

As shown in FIG. 8B and FIG. 9A, in the partition wall 62, a support hole 622 is provided in a position intersecting with the rotational axis (a rotational axis X2) of the magnet 25.

As shown in FIG. 8B, in the support hole 622, the support shaft 510 of the support wall 51 penetrates in the rotational axis X2 direction when the moving block 6 is assembled to the intermediate member 5, and the partition wall 62 is supported to be capable of swinging by the support wall 51 on the intermediate member 5-side.

In the partition wall 62, a periphery of the support hole 622 acts as a connection portion for causing the intermediate member 5 to support the moving block 6.

As shown in FIGS. 8A and 8B, the partition wall 63, which is disposed with a space from the partition wall 62, is provided with a support hole 632 in a position that intersects with the rotational axis X2.

At the opposite side (the right side in the drawing) to the partition wall 62 as seen from the partition wall 63, the support wall 73 having a support hole 732 which forms a pair with the support hole 632 is provided.

As seen from above at the cover 4-side, the support hole 632 on the partition wall 63-side, and the support hole 732 on the support wall 73-side are located on the rotational axis X2 of the magnet 25.

As shown in FIG. 8B, the support holes 632 and 732 respectively open upward to the cover 4-side, and a shaft section 251 on an outer periphery of which the magnet 25 is fixed is assembled to the support holes 632 and 732 from above at the cover 4-side.

As shown in FIGS. 8A and 8B, in the support hole 632 of the partition wall 63, one end 251a of the shaft section 251 is rotatably supported, and in the support hole 732 of the support wall 73, the other end 251b of the shaft section 251 is supported to be rotatable.

In this state, the shaft section 251 of the magnet 25 is disposed to be rotatable around the rotational axis X2 in an orientation along the rotational axis X2.

As shown in FIG. 8B, the second gear 24 is externally fitted and fixed to one end side 251a side of the shaft section 251. The second gear 24 is a gear with a flange portion 241, and the flange portion 214 is positioned in a position where the flange portion 241 is caused to abut on a large diameter section 252 provided at the shaft section 251 from the direction of the rotational axis X2.

The bottom wall section 70, which bridges over a lower portion of the partition wall 63 and a lower portion of the support wall 73, is provided with a recessed section 702 for avoiding interference with the flange portion 241 of the second gear 24, and a thin-walled section 701 that surrounds the outer periphery of the magnet 25.

In the bottom wall section 70, a portion corresponding to the thin-walled section 701 is formed to be thinner than the other portions.

As seen from the support wall 73, at the opposite side (the right side in the drawing) to the partition wall 63, a connection section 74 having a support hole 742 is provided.

The connection section 74 is provided to extend upward from the bottom wall section 70, and the support hole 742 as described above is provided in a position that intersects with the rotational axis X2.

As shown in FIG. 5B, at the time of assembling the moving block 6 to the intermediate member 5, the support shaft 520 of the support wall 52 penetrates through the support hole 742 in the direction of the rotational axis X2, and the connection section 74 is supported to be capable of swinging by the support wall 52 at the intermediate member 5-side.

In this state, the magnet 25 is supported to be rotatable around the rotational axis X2 by the partition wall 63 and the support wall 73, between support points of the moving block 6, by the pair of support walls 51 and 52 in the direction of the rotational axis X2.

As shown in FIG. 8A, the partition wall 63 is provided with a support hole 633 that rotatably supports a shaft section 231 of the transmission gear 23 in a region between the support hole 632 and the support hole 631.

As seen from the partition wall 63, at the opposite side (the right side in the drawing) to the partition wall 62, a support wall 72 having a support hole 723 which forms a pair with the support hole 633 is provided.

As seen from above at the cover 4-side, the support hole 633 on the partition wall 63-side, and the support hole 723 on a support wall 72-side are located on a rotational axis X3 that is in parallel with the rotational axis X1 of the rotatable knob 20 and the rotational axis X2 of the magnet 25.

As shown in FIG. 8A, the support holes 633 and 723 respectively open upward to the cover 4-side, and the transmission gear 23 is assembled to the support holes 633 and 723 from above at the cover 4-side.

As shown in FIG. 8A, in the support hole 633 of the partition wall 63, one end of the shaft section 231 of the transmission gear 23 is supported to be rotatable, and in the support hole 723 of the support wall 73, the other end of the shaft section 231 is supported to be rotatable.

In this state, the shaft section 231 of the transmission gear 23 is disposed to be rotatable around the rotational axis X3 in an orientation along the rotational axis X3.

As shown in FIG. 9C, the transmission gear 23 is provided to be meshed with the first gear 22 on the rotatable knob 20-side, and the second gear 24 on the magnet 25-side.

As seen from above at the cover 4-side, the first gear 22, the transmission gear 23 and the second gear 24 are arranged side by side on an axis Y (see FIG. 8A) that is orthogonal to the rotational axis X1.

In the present embodiment, the first gear 22, the transmission gear 23 and the second gear 24 configure the reduction gear train G.

Note that the reduction gear train G may include a plurality of transmission gears 23.

The moving block 6 is provided with a connection beam 75 that connects a region at the side wall 65-side (the lower side in FIG. 8A) of the partition wall 63, and a region in the vicinity of the support wall 73.

As seen from above at the cover 4-side, the connection beam 75 is formed in a substantially L-shape, and a plate-shaped guide plate 76 is provided at a lateral surface at the side wall 65-side in the connection beam 75.

The guide plate 76 extends in a direction (downward in FIG. 8A) to separate from the rotational axes X1 and X2. A protrusion length L1 of the guide plate 76 is set at such a length that the guide plate 76 is inserted between the pair of guide pillars 53 and 53 which are provided at the intermediate member 5 when the moving block 6 is assembled to the intermediate member 5.

Further, a pressing rod 77 is provided on a surface, which faces the intermediate member 5, of the connection beam 75 (see FIG. 10A).

The pressing rod 77 extends downward to the printed board P-side. An extension length L2 of the pressing rod 77 is set at such a length that the pressing rod 77 is across a through hole 541 provided in the intermediate member 5 downward to the printed board P-side, and abuts on a top surface of a push switch 92 that is provided on the printed board P when the moving block 6 is assembled to the intermediate member 5 (refer to FIGS. 10A and 10B).

Here, an urging force F in a direction to displace the pressing rod 77 upward to the cover 4-side acts on the pressing rod 77 from the push switch 92.

As described above, the moving block 6 is swingable around the rotational axis X2. Therefore, a rotational force R in a direction to rotate the moving block 6 around the rotational axis X2 acts on the moving block 6 by the urging force F which acts from a push switch 92-side.

As described above, the intermediate member 5 is provided with the stopper rod 55 (see FIG. 4) having the locking claw 550. As shown in FIG. 9A, the locking claw 550 is locked to the locking section 602 on the moving block 6-side, and displacement in a direction (see an arrow in the drawing) in which the rotational force R of the moving block 6 acts is restricted.

In other words, when the pressing force does not act on the rotatable knob 20, the moving block 6 is held in a position where the locking section 602 which is formed integrally with the moving block 6 is in pressure contact with the locking claw 550 of the stopper rod 55 by the urging force F which acts from the push switch 92-side. Thereby, unsteadiness of the rotatable knob 20 and the moving block 6 which supports the rotatable knob 20 is suppressed.

When the moving block 6 is assembled to the intermediate member 5 to be supported to be capable of swinging by the pair of support walls 51 and 52, the thin-walled section 701 of the bottom wall section 70 is disposed in an outer side in the radial direction of the magnet 25 in the switch device 1, as shown in FIG. 5B.

Further, a thin-walled section 56 of the protection member (the intermediate member 5) which covers the top surface of the printed board P on the cover 4-side is disposed in an outer side in the radial direction of the thin-walled section 701.

The thin-walled section 56 is formed to be thinner than the other regions of the intermediate member 5. In the switch device 1, a magnetic sensor 91 that is placed on the printed board P (the fixed-side member) is housed in a gap that is formed by the thin-walled section 56. The magnetic sensor 91 faces the outer periphery of the magnet 25 from outside in the radial direction of the rotational axis X2 of the magnet 25.

In the switch device 1, the outer periphery of the magnet 25 and the magnetic sensor 91 face each other across the thin-walled section 701 on the moving block 6-side and the thin-walled section 56 on the intermediate member 5-side outside in the radial direction of the rotational axis X2 of the magnet 25. In this state, the outer periphery of the magnet 25 and the magnetic sensor 91 face each other with a separation distance h, outside in the radial direction of the rotational axis X2 of the magnet 25.

In the present embodiment, the magnetic sensor 91 is disposed under the thin-walled section 56, and by an output signal of the magnetic sensor 91, an angular position of the magnet 25 around the rotational axis X2, and an angular position of the rotatable knob 20 around the rotational axis X1 are configured to be specified.

FIGS. 11A and 11B are schematic views explaining an operation of the switch device 1. In FIG. 11, a process of the moving block 6 displacing around the rotational axis X2 by the pressing operation on the rotatable knob 20 is explained. FIG. 11A is a drawing showing a state before the moving block 6 displaces around the rotational axis X2. FIG. 11B is a drawing showing a state after the moving block 6 displaces around the rotational axis X2 by the pressing operation on the rotatable knob 20.

In the switch device 1, the rotation shaft of the magnet 25 is provided to coincide with the rotational axis X2 which is the swing axis of the moving block 6. Therefore, even when the rotatable knob 20 is pressed by the finger of the user and the moving block 6 displaces around the rotational axis X2, the magnet 25 does not displace.

Consequently, the separation distance h between the magnet 25 and the magnetic sensor 91 is configured not to change before and after the pressing operation on the rotatable knob 20.

Further, when the rotatable knob 20 rotates around the rotational axis X1 by the fingers of the user, the rotation of the rotatable knob 20 is transmitted to the magnet 25 via the reduction gear train G, and the magnet 25 rotates around the rotational axis X2.

Consequently, a magnet pole surface of the magnet 25 that faces the magnetic sensor 91 changes in conjunction with the rotation around the rotational axis X2 of the magnet 25. As a result, an unillustrated control device that processes the output signal of the magnetic sensor 91 is configured to be capable of specifying the angular position around the rotational axis X1 of the rotatable knob 20.

Figure 12A:
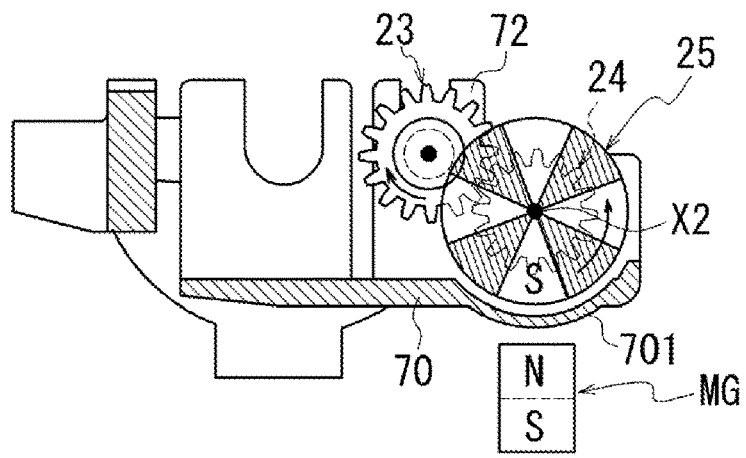
FIGS. 12A to 12C are drawings explaining an assembly process of a magnet in the rotary switch and a reduction gear train.
Figure 12B:
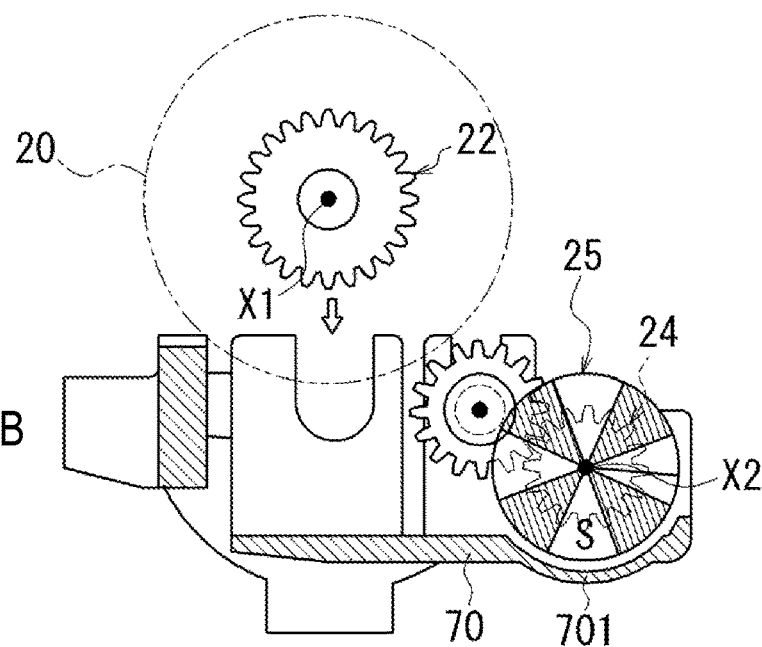
Figure 12C:
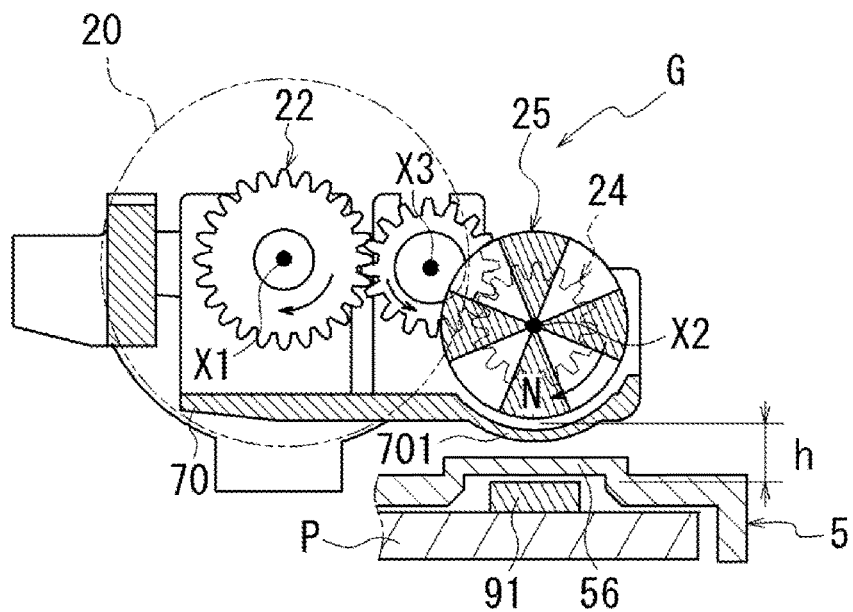

FIGS. 12A to 12C are diagrams explaining an assembling process of the reduction gear train G.

FIG. 12A is a diagram explaining positioning of the magnet 25, which is a diagram explaining positioning in a state where the transmission gear 23 of the reduction gear train G, and the second gear 24 on the magnet 25-side are meshed with each other.

FIG. 12B is a diagram explaining assembly of the first gear 22 on the rotatable knob 20-side after completion of the positioning. FIG. 12C is a diagram showing a time point at which assembly of the reduction gear train G is completed.

As described above, in the rotary switch 2, the rotation of the rotatable knob 20 is transmitted to the magnet 25 via the reduction gear train G. Therefore, the magnet 25 rotates around the rotational axis X2 in conjunction with the rotation around the rotational axis X1 of the rotatable knob 20.

In the assembly of the reduction gear train G, the transmission gear 23 of the reduction gear train G is supported between the partition wall 63 and the support wall 72 of the moving block 6, and the magnet 25 is disposed in the housing section S2 of the magnet 25 (see FIG. 6A).

In this state, the transmission gear 23 is supported to be rotatable between the pair of the partition walls 63 and the support wall 72 of the moving block 6. The magnet 25 is supported to be rotatable between the partition wall 63 and the support wall 73 of the moving block 6.

The transmission gear 23 is meshed with the second gear 24 on the magnet 25-side to be capable of transmitting rotation therebetween. The transmission gear 23 is supported to be rotatable by the moving block 6 with the magnet 25 in a state where the transmission gear 23 is meshed with the second gear 24.

In this state, a magnet MG for positioning is disposed in a position facing the magnet 25 across the bottom wall section 70 (the thin-walled section 701) therebetween. In doing so, in a case of FIG. 12A, the magnet 25 is positioned in an angular position where an S pole is disposed in a position facing an N pole of the magnet MG for positioning.

In other words, the angular position around the rotational axis X2 of the magnet 25 is positioned by the magnet MG for positioning.

Here, in FIGS. 12A to 12C, the N poles are shown by applying hatching to the N poles in order to enable positions of axial poles of the magnet to be visually recognized, but in the actual switch device 1, characters, marks and the like that indicate the positions of magnetic poles are not attached to the surface of the magnet 25.

The magnet 25 is positioned by using the magnet MG for positioning, and thereby the magnet 25 can be always positioned in the same position.

In this state, the first gear 22 on the rotatable knob 20-side is brought close to the transmission gear 23 from above (see FIG. 12B), and is meshed with the transmission gear 23, and the rotatable knob 20 is supported to be rotatable by the moving block 6.

Thereupon, with advancement of meshing of the first gear 22 with the transmission gear 23, the transmission gear 23 and the second gear 24 respectively rotate around the rotational axes X3 and X2 (see FIG. 12C).

Subsequently, at a time point when assembly of the rotatable knob 20 is completed, the magnet 25 is positioned in a predetermined position that is determined in accordance with an initial disposition (disposition in FIG. 12A) (see FIG. 12C).

Thereby, the reduction gear train G can be assembled with the magnetic pole face of the magnet 25 always aligned in the same direction.

Subsequently, the moving block 6 after completion of the assembly of the reduction gear train G is assembled to the intermediate member 5 to be supported to be capable of swinging, and thereby the magnet 25 can be disposed with the same magnetic pole face always facing the magnetic sensor 91 on the printed board P.

Accordingly, by determining the initial position of the magnet 25 and the angular position around the rotational axis X1 of the rotatable knob 20 in advance in association with each other, a work of correlating the angular position of the rotatable knob 20 around the rotational axis X1 with the position of the magnet 25 becomes unnecessary after the assembly of the switch device 1.

For example, for establishing a correlation between the angular position of the rotatable knob 20 around the rotational axis X1, and the position of the magnet 25, it is necessary to correlate the output signal of the magnetic sensor 91 with the angular position of the rotatable knob 20 around the rotational axis X1 by rotating the magnet 25 around the rotational axis X2 by at least one turn.

Since the switch device 1 of the present embodiment does not require the correlating work like this, it becomes possible to reduce working costs for assembling the switch device 1.

As described above, the switch device 1 according to the present embodiment has the following configuration.

The switch device 1 includes the rotatable knob 20 that is provided to be rotatable around the rotational axis X1 (the first axis) and to be capable of swinging around the rotational axis X2 (the second axis) in parallel with the rotational axis X1, the magnet 25 that is disposed coaxially with the rotational axis X2 and is configured to rotate in conjunction with the rotation of the rotatable knob 20, the magnetic sensor 91 that is provided on the printed board P (the fixed-side member) and is disposed to face the outer periphery of the magnet 25, and the reduction gear train G (gear train) configured to transmit the rotation of the rotatable knob 20 to the magnet 25.

According to the configuration as above, the magnet 25 is provided coaxially with the rotational axis X2 that is the swing axis of the rotatable knob 20, and therefore, when the rotatable knob 20 is pressed and the rotatable knob 20 is swung in the circumferential direction around the rotational axis 2 (at the swing operation time), the positional relationship between the magnetic sensor 91 and the magnet 25 does not change.

In other words, the separation distance h between the magnet 25 and the magnetic sensor 91 does not change before and after the swing operation of the rotatable knob 20.

When the positional relationship between the magnetic sensor 91 and the magnet 25 changes at the swinging operation of the rotatable knob 20, it is necessary to adopt the magnetic sensor with high sensitivity. However, it is possible to use a magnetic sensor at a lower price and with low sensitivity since the positional relationship between the magnetic sensor and the magnet does not change.

Consequently, the switch device 1 in which different functions are assigned to the rotation operation around the rotational axis X1 of the rotatable knob 20 and the swing operation around the rotational axis X2 of the rotatable knob 20 can be provided at a lower price.

The switch device 1 according to the present embodiment has the following configuration.

(2) The reduction gear train G includes the first gear 22 that is provided coaxially with the rotatable knob 20 and is configured to rotate integrally with the rotatable knob 20, the second gear 24 that is provided coaxially with the magnet 25 and is configured to rotate integrally with the magnet 25, and at least the one transmission gear 23 that is provided on the rotation transmission path of the first gear 22 and the second gear 24.

According to the configuration as above, the reduction gear train G can be completed by assembling the transmission gear 23 after the angular position around the rotational axis X1 of the rotatable knob 20 and the angular position around the rotational axis X2 of the magnet 25 are adjusted respectively.

Consequently, it is possible to easily perform the positioning of the rotatable knob 20 and the positioning of the magnet 25 at the time of assembly of the switch device 1.

The switch device 1 according to the present embodiment has the following configuration.

(3) The magnet 25 is formed to have a smaller outside diameter than an outside diameter of the rotatable knob 20.

The reduction gear train G is a reduction gear train that reduces the rotation around the rotational axis X1 of the rotatable knob 20 and transmits the reduced rotation to the magnet 25.

When the rotatable knob 20 and the magnet 25 having the smaller outside diameter than that of the rotatable knob 20 are connected on the same axis and integrally rotate, a total number of functions that are settable in accordance with the angular position around the rotational axis becomes the smaller in the rotatable knob 20 as the outside diameter of the magnet becomes smaller.

As described above, the rotation of the rotatable knob 20 is caused to be reduced by the reduction gear train G, which is transmitted to the magnet 25, and therefore, the total number of functions that are settable in accordance with the angular position around the rotational axis X1 can be increased in the rotatable knob 20.

Consequently, multi-functionalization of the functions to be assigned to the rotatable knob 20, and fine control of the functions are made possible.

The switch device 1 according to the present embodiment has the following configuration.

(4) The switch device 1 includes the moving block 6 (the holder) configured to support the rotatable knob 20, the magnet 25 and the reduction gear train G.

The moving block 6 is provided to be capable of swinging around the rotational axis X2.

According to the configuration as above, the rotatable knob 20, the magnet 25 and the reduction gear train G can be prepared in a state of being assembled to the moving block 6 in advance. In other words, the rotatable knob 20, the magnet 25 and the reduction gear train G can be provided as sub-assembled parts. Therefore, a reduction in the assembling time of the switch device 1 can be expected, and as the time is reduced, a reduction in assembly costs can be expected.

The switch device 1 according to the present embodiment has the following configuration.

(5) The moving block 6 is supported to be capable of swinging around the rotational axis X2 by the intermediate member 5 (the protection member) that protects the printed board P on which the magnetic sensor 91 is provided.

The moving block 6 has the bottom wall section 70 (the wall section) surrounding the outer periphery of the magnet 25, and has the region, which faces the magnetic sensor 91, in the bottom wall section 70, the region being formed as the thin-walled section 701 that is formed to be thinner than the other regions.

The magnet 25 faces the magnetic sensor 91 with the thin-walled section 701 (the thin region) interposed between the magnet 25 and the magnetic sensor 91 in the radial direction of the rotational axis X2.

According to the configuration like this, the separation distance h between the magnet 25 and the magnetic sensor 91 in the radial direction of the rotational axis X2 can be made smaller. Consequently, the magnetic sensor 91 can be replaced with a sensor at a low price and with lower sensitively.

The switch device 1 according to the present embodiment has the following configuration.

(6) In the intermediate member 5 (the protection member), the printed board P (the fixed-side member) on which the magnetic sensor 91 is provided is disposed on the opposite side to the moving block 6 (the holder).

In the intermediate member 5 (the protection member), the region facing the magnetic sensor 91 is the thin-walled section 56 which is formed to be thinner than the other regions.

The magnet 25 and the magnetic sensor 91 face each other with the thin-walled section 701 (the thin region) on the moving block 6-side, and the thin-walled section 56 (the thin region) on the intermediate member 5 (the protection member)-side interposed between the magnet 25 and the magnetic sensor 91, in the radial direction of the rotational axis X2.

According to the configuration like this, the separation distance h between the magnet 25 and the magnetic sensor 91 in the radial direction of the rotational axis X2 can be made smaller. Consequently, the magnetic sensor can be replaced with a sensor at a lower price and with lower sensitivity.

The switch device 1 according to the present embodiment has the following configuration.

(7) The moving block 6 (the holder) includes the pressing rod 77 that extends to the printed board P-side, in a portion facing the intermediate member 5 (the protection member).

The pressing rod 77 is provided closer to an outside diameter side than the rotational axis X1, as seen from the rotational axis X2, penetrates through the through hole 541 provided in the intermediate member 5, and makes contact with the push switch 92 installed on the printed board P.

In conjunction with the swinging of the moving block 6 around the rotational axis X2, the push switch 92 is turned on and off by the pressing rod 77.

According to the configuration as above, the swing angle of the moving block 6 that is necessary for the on/off operation of the push switch 92 can be suppressed.

Thereby, when the rotatable knob 20 is pressed to cause the moving block 6 to swing around the rotational axis X2, the angle range (the rotation angle of the magnet 25) of the magnet 25 rotating around the rotational axis X2 can be suppressed.

When the rotatable knob 20 is pressed to cause the moving block 6 to swing around the rotational axis X2, if the magnet 25 rotates greatly around the rotational axis X2, there is a possibility that the magnetic sensor 91 detects a different magnetic pole of the magnet 25, and erroneously detects the angular position around the rotational axis X2 of the magnet 25.

Since the angle range (the rotation angle of the magnet 25) of the magnet 25 rotating around the rotational axis X2 can be suppressed, the possibility of erroneous detection of the angular position around the rotational axis X2 of the magnet 25 can be reduced.

The switch device 1 according to the present embodiment has the following configuration.

(8) The intermediate member 5 (the protection member) is provided with the pair of support walls 51 and 52 with the space in the direction of the rotational axis X2.

In the moving block 6, the magnet 25 is supported to be rotatable around the rotational axis X2, between the support points by the pair of support walls 51 and 52 in the direction of the rotational axis X2.

According to the configuration as above, the swing axis of the moving block 6 and the rotational axis of the magnet 25 can be caused to coincide with each other with higher precision. As a result, the angular position of the magnet 25 that rotates in conjunction with the rotation of the rotatable knob 20 can be detected with higher precision.

Note that the switch device 1 according to the present embodiment can also be specified as the assembling method of the switch device.

(9) The switch device 1 that is assembled by the assembly method of the switch device 1 includes the rotatable knob 20 that is provided to be rotatable around the rotational axis X1 (the first axis) and to be capable of swinging around the second rotational axis X2 (the second axis) in parallel with the rotational axis X1, the magnet 25 that is disposed coaxially with the rotational axis X2 and rotates in conjunction with the rotation of the rotatable knob 20, the magnetic sensor 91 that is provided at the printed board P (the fixed-side member) and is disposed to face the outer periphery of the magnet 25, the reduction gear train G (the gear train) configured to transmit the rotation of the rotatable knob 20 to the magnet 25, and the moving block 6 (the holder) configured to support the rotatable knob 20, the magnet 25 and the reduction gear train G.

The reduction gear train G includes the first gear 22 provided coaxially with the rotatable knob 20 and configured to rotate integrally with the rotatable knob 20, the second gear 24 provided coaxially with the magnet 25 and configured to rotate integrally with the magnet 25, and the transmission gear 23 provided on the rotation transmission path of the first gear 22 and the second gear 24.

The assembly method includes the following steps.

the step of rotatably supporting the transmission gear 23 by the moving block 6 (the holder) with the magnet 25 in a state in which the transmission gear 23 is meshed with the second gear 24.

(b) the step of positioning the angular position (fixing the angular position) around the rotational axis X2 of the magnet 25, with the magnet MG for positioning.

(c) the step of supporting the rotatable knob 20 rotatably with the moving block 6 (the holder) by meshing the first gear 22 with the transmission gear 23 after the angular position around the rotational axis X2 of the magnet 25 is positioned.

By positioning the magnet 25 by using the magnet MG for positioning, the magnet 25 can always be positioned in the same position.

When the first gear 22 is brought close to the transmission gear 23 from above and is meshed with the transmission gear 23, the rotatable knob 20 and the magnet 25 are positioned to the predetermined positions that are determined in accordance with the initial disposition of the magnet 25 at the time point at which assembly of the rotatable knob 20 having the first gear 22 is completed.

As a result, the assembly of the reduction gear train G can be performed with the orientations of the magnetic pole faces of the magnet 25 always aligned in the same directions.

Subsequently, when the moving block 6 after completion of the assembly of the reduction gear train G is assembled to the intermediate member 5 and is supported to be capable of swinging, the magnet can be disposed with the same magnetic face always facing the magnetic sensor 91 on the printed board P.

Consequently, the initial position of the magnet 25 and the angular position around the rotational axis X1 of the rotatable knob 20 are determined in association with each other in advance, whereby the work of correlating the angular position around the rotational axis X1 of the rotatable knob 20 and the position of the magnet 25 becomes unnecessary after the assembly of the switch device 1.

The embodiment and the modifications of the present invention are described thus far, but the present invention is not limited to the embodiment and the modifications, and can be changed as needed within the range of the technical concept of the invention.

What is claimed is:

1. A switch device, comprising:
   a rotatable knob that is provided to be rotatable around a first axis and to be capable of swinging around a second axis in parallel with the first axis;
   a magnet that is disposed coaxially with the second axis and is configured to rotate in conjunction with rotation of the rotatable knob;
   a magnetic sensor that is provided on a fixed-side member and is disposed to face an outer periphery of the magnet; and
   a gear train configured to transmit the rotation of the rotatable knob to the magnet.

2. The switch device according to claim 1, wherein the gear train comprises:
   a first gear configured to rotate integrally with the rotatable knob,
   a second gear configured to rotate integrally with the magnet, and
   at least one transmission gear that is provided on a rotation transmission path of the first gear and the second gear.

3. The switch device according to claim 2, wherein:
   the magnet is formed to have a smaller outside diameter than an outside diameter of the rotating knob, and
   the gear train is a reduction gear train that reduces rotation of the rotatable knob and transmits the reduced rotation to the magnet.

4. The switch device according to claim 3, comprising:
a holder configured to support the rotatable knob, the magnet and the gear train,
wherein the holder is provided to be capable of swinging around the second axis.

5. The switch device according to claim 4, wherein:
the holder is supported to be capable of swinging around the second axis by a protection member that protects a board on which the magnetic sensor is provided,
the holder has a wall portion that surrounds the outer periphery of the magnet, and has a region, which faces the magnetic sensor, in the wall portion, the region being formed to be thinner than the other regions, and
the magnet faces the magnetic sensor with the thin region interposed between the magnet and the magnetic sensor in a radial direction of the second axis.

6. The switch device according to claim 5, wherein:
in the protection member, the fixed-side member that is a board on which the magnetic sensor is provided is disposed on the opposite side to the holder,
in the protection member, a region facing the magnetic sensor is formed to be thinner than the other regions, and
the magnet and the magnetic sensor face each other with the thin region on a holder side, and a thin region on a protection member side interposed between the magnet and the magnetic sensor, in the radial direction of the second axis.

7. The switch device according to claim 6, wherein:
the holder includes a pressing rod that extends to the board side, in a portion facing the protection member,
the pressing rod is provided closer to an outside diameter side than the first axis, as seen from the second axis, penetrates through a through hole provided in the protection member, and makes contact with a push switch installed on the board, and
in conjunction with the swinging of the holder, the push switch is turned on and off by the pressing rod.

8. The switch device according to claim 7, wherein:
a pair of support walls are provided in the protection member with a space in the second axial direction, and
in the holder, the magnet is supported to be rotatable around the second axis, between support points by the pair of support walls in a direction of the second axis.

9. An assembly method of a switch device,
the switch device including:
a rotatable knob that is provided to be rotatable around a first axis and to be capable of swinging around a second axis in parallel with the first axis,
a magnet that is disposed coaxially with the second axis and is configured to rotate in conjunction with rotation of the rotatable knob,
a magnetic sensor that is provided on a fixed-side member and is disposed to face an outer periphery of the magnet,
a gear train configured to transmit the rotation of the rotatable knob to the magnet, and
a holder configured to support the rotatable knob, the magnet, and the gear train, the gear train including:
a first gear configured to rotate integrally with the rotatable knob,
a second gear configured to rotate integrally with the magnet, and
a transmission gear provided on a rotation transmission path of the first gear and the second gear,
the assembly method comprising:
rotatably supporting the transmission gear by the holder with the magnet in a state in which the transmission gear is meshed with the second gear;
positioning an angular position around the second axis of the magnet, with a magnet for positioning; and
supporting the rotatable knob rotatably with the holder by meshing the first gear with the transmission gear after the positioning of the magnet.

* * * * *